United States Patent [19]

Hopfield

[11] Patent Number: 4,660,166
[45] Date of Patent: Apr. 21, 1987

[54] ELECTRONIC NETWORK FOR COLLECTIVE DECISION BASED ON LARGE NUMBER OF CONNECTIONS BETWEEN SIGNALS

[75] Inventor: John J. Hopfield, Pasadena, Calif.

[73] Assignees: Bell Telephone Laboratories, Incorporated, Murray Hill, N.J.; California Institute of Technology, Pasadena, Calif.

[21] Appl. No.: 693,479

[22] Filed: Jan. 22, 1985

[51] Int. Cl.[4] .............................................. G06F 15/46
[52] U.S. Cl. ................................... 364/807; 364/300; 364/131
[58] Field of Search ............... 364/807, 300, 900, 165, 364/158, 715, 156, 132, 149, 151, 131

[56] References Cited

U.S. PATENT DOCUMENTS

| 3,891,836 | 6/1975 | Lee | 364/132 |
|---|---|---|---|
| 3,934,124 | 1/1976 | Gabriel | 364/165 |
| 3,934,231 | 1/1976 | Armstrong | 364/900 |
| 3,950,733 | 4/1976 | Cooper | 364/900 |
| 4,254,474 | 3/1981 | Cooper | 364/900 |
| 4,326,259 | 4/1982 | Cooper | 364/900 |

OTHER PUBLICATIONS

"Linear Programming on an Electronic Analogue Computer", *Trans. AIEE Part I (Comm. & Elect.)*, vol. 75, I. B. Pyne, 1956, pp. 139–143.

*Primary Examiner*—Michael R. Fleming
*Attorney, Agent, or Firm*—Freilich, Hornbaker, Rosen & Fernandez

[57] ABSTRACT

Amplifiers, optionally having complementary (positive and negative) outputs, are connected to a matrix of input and output conductors (where the output conductors are each a pair for the case of complementary amplifier outputs). Each connection is implemented with a resistors $R_{ij}=R_{ji}$ connecting the output(s) of amplifiers j to the input of amplifiers i, and vice versa, where i and j are the ith and jth amplifiers not necessarily in sequence. The value of each resistor is selected for the nature of the decisional operation intended to satisfy the following circuit equation of motion $$C_i(du_i/dt) = u_i/p_i \sum_j T_{ij}V_j + T_i$$

where $V_j = g(u_j)$ the output of amplifier j due to an input $u_i$, $C_i$ is the input capacitance of amplifier i, and $R_i$ is the equivalent of $p_i$ and $R_{ij}$ according to the equation $$1/R_i = 1/p_i + \sum_j 1/R_{ij}$$

and $R_{ij}=R_{ji}$. For the implementation of an associative memory, only positive (or negative) output terminals need be connected by resistors of unit value to input terminals of amplifiers i and j for the amplifier i in which a binary 1 is to be stored. (The amplifier j is one or more of the other amplifiers.) The outputs of the array of amplifiers will produce the entire word stored in response to a few bit-1 input signals $I_i$ to amplifiers so connected by resistors $R_{ij}$. For problem solution, the resistance $R_{ij}=R_{ji}$ is selected to have a value that, with appropriate signals at all input conductors (perhaps zero) the network will collectively drive to a stable state at the complementary output terminals which provide an output code word that is a very good solution to the problem.

10 Claims, 15 Drawing Figures

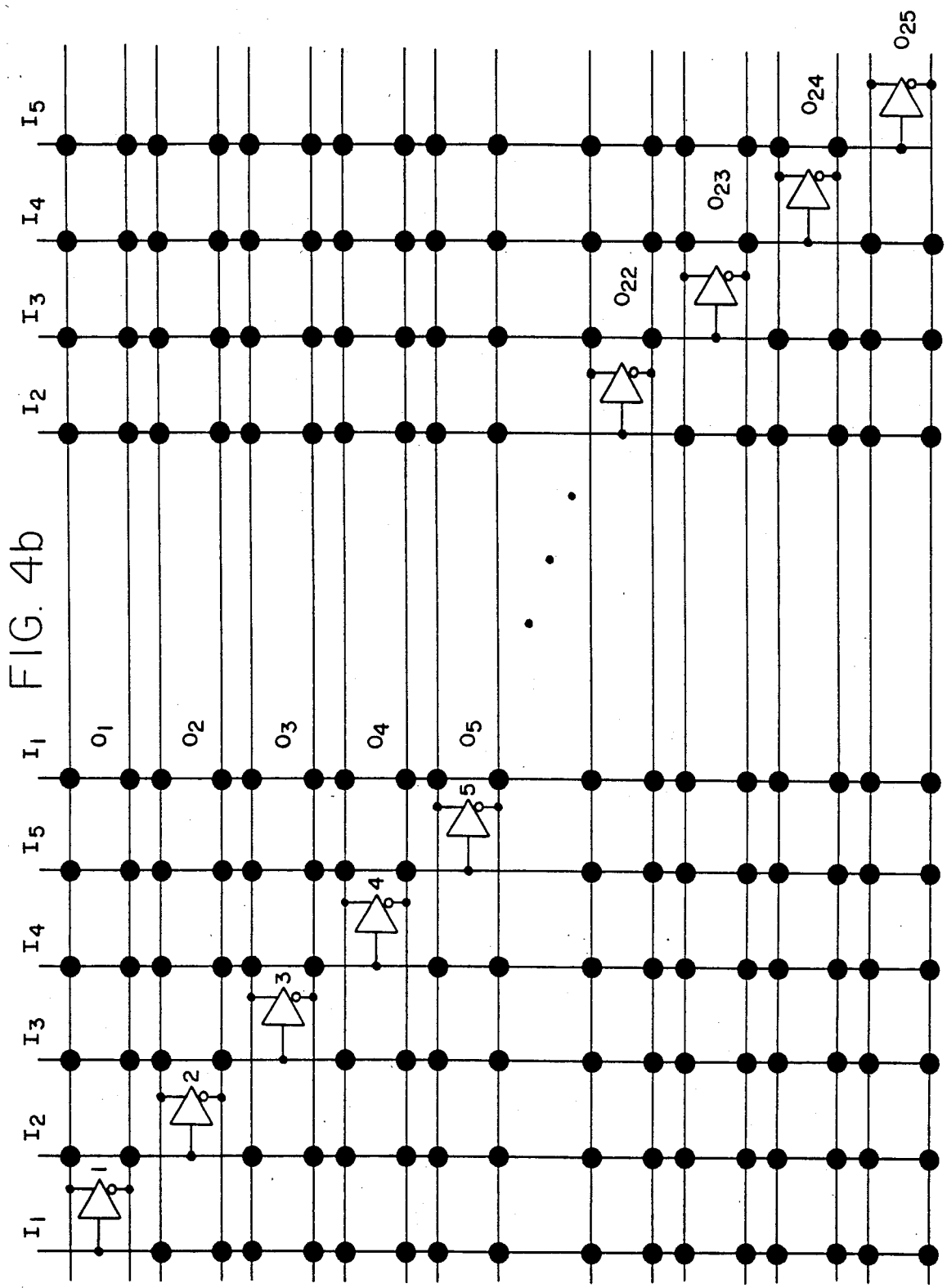

ELECTRONIC NETWORK FOR COLLECTIVE DECISION BASED ON LARGE NUMBER OF CONNECTIONS BETWEEN SIGNALS

ORIGIN OF INVENTION

The invention described herein was made in the performance of work by California Institute of Technology, Pasadena, Calif. under a Grant No. DMR-8107494 with the National Science Foundation.

BACKGROUND OF THE INVENTION

This invention relates to a network of nonlinear devices having continuous (graded response) input-output relations for parallel processing of input signals, and obtaining useful collective decisional responses (to which all of the input signals make a contribution to some degree in the range from 0 to 100%), such as in retrieving discrete information from the network functioning as a content addressable (associative) memory, or in finding a discrete solution to a problem. Because of similarities with real biological neurons, the nonlinear devices are sometimes referred to hereinafter as "neurons" or "neuronal circuits," and the parallel processing of input signals for a collective decision as "neuronal computation."

Many practical problems take such an enormous amount of computation that a solution in real time is not possible. An example is selecting from memory information that best satisfies known characteristics or descriptors, which may be referred to as "clues," but which are insufficient to completely define the information thus retrieved. The present device differs from associative memories of the prior art which use a binary word as a search key that represents a particular value of all or some of the bits in the information word. The key is then compared in a discrete or logical calculation with corresponding tag bits of all stored words, similar to retrieving a particular automobile part in inventory where a code affixed to the part is used to retrieve the part itself. Such an associative memory will access only a particular word of information, unless the key is loose, i.e., has too few attributes that define properties of the information desired. There is no simple representation possible of the degree of confidence to be placed in particular elements of the key. One is then faced (in software or hardware) with the task of reviewing a long list of information words that match the loose key. It would be desirable to have an associative memory that directly and rapidly accesses only one particular information word that best matches the clues, to the exclusion of all others. If the user then determines that was not the correct information, he need only revise the clues.

Pattern recognition is another example of such a problem. In order for reasonable scale special purpose digital computers to cope with recognition tasks in real time, the sensory data must be in a particular format for recognition of a limited set of objects that must be presented in a predetermined orientation. An optical character reader, for example, is limited to one or a few sets of fonts, and each character to be recognized must be properly oriented. While some defects in the characters may be tolerated, major defects or change in font cannot. This is because of the nature of the logic used in a digital system for reducing the input data to the desired recognition decision. Each binary logic gate in a digital system will typically obtain input signals from two or three other gates, and a huge member of independent binary decisions are made in the course of a computation. The gates are influenced at any stage only by process data in a small amount of information. Intermediate solution signals must be stored for use in the next phase of the solution, and many successive phases must be used in order to evaluate the information as a whole. In the present invention, each nonlinear device gets inputs from many or all other devices for a collective decision to be made (in a single phase or convergence time) from all of the input signals presented on the basis of the simultaneous interactions of the devices in the network, which may be expanded virtually without limit to accommodate as large a base of input information as may reasonably be expected for the nature of the problem.

In order that the nature and full scope of the invention be better appreciated, an associative memory will first be described and then the kind of computational problems which may be solved will be described. Following that, the classic "traveling salesman problem" (TSP) will be discussed as a specific example of a more complex computation problem. The nature of this TSP is similar to the categorization problems inherent to perception, such as character recognition, but no appropriate simple model is available as a specific example of perception. The kinds of computational problems which lend themselves to solution by the present invention are those in which a rapid 'good enough' discrete interpretation of input signals is desired, which can be described as a 'good solution' (or a mathematical extremum) subject to conflicting constraints.

There are many problems outside of perception which are difficult because they involve the following aspects of perception.

1. The reduction of a set of analog input signals to a set of digital or quantized output signals which reflect the analysis of the objects and relationships in the scene.
2. A single general Gestalt interpretation at a broad level is required. Because of the intrinsic noise and incompleteness in the sensory data, ambiguities of interpretation may remain at a fine scale. It is relatively unimportant from a perceptual viewpoint to disambiguate the fine details, and interpretations differing in fine details may be regarded as the same or equally valid. ("Best" is not definable with precision.)
3. Invariance, or appropriate minor changes, in the interpretation over appropriate classes of change of input date, e.g., an object in the scene doesn't change by being moved one foot in the visual field, a background such as a lawn does not depend on locations of individual blades of grass, changing the angle of an object's elements such as a person's arms and legs does not change the person's relationship to another object in the scene . . . .
4. As many as possible of the modes of processing and aspects of the data should be simultaneously brought to bear in parallel in searching for a "best" solution. The information is normally sufficiently strong that a time consuming (or hardware consuming) sequential consideration of special particular hypotheses is not necessary.

The placement of integrated circuit chips on a circuit board is typical of such problems. Given a circuit diagram which describes the interconnections between 75 chips, each having 16 pins, locate the chips on a circuit board such that, the total length of wire used is as small as possible, the length of the longest wire is as short as possible, the number of wires in different wiring channels is as uniform as possible, and the maximum wire depth is as small as possible. These criteria conflict, and a "best" arrangement involves trade-offs. The physical reasons for such criteria are such as to make them significant quantitative goals but not necessities. A really good solution tends to have many almost as good. There may also be many very good local optima which are comparably good, and the true object of a designer is to find one of these, not be obsessed with finding the absolute best solution. In any event the mathematical definition of "best" will be somewhat arbitrary weighing of rather different criteria. These characteristics are shared with perception problems.

The TSP is a classic example of such optimization. It is simple to describe, mathematically well characterized, and makes a good vehicle for describing the use of neuronal circuits to solve constrained optimization problems. A set of n cities, A, B, C, . . . have pairwise distance of separation $d_{AB}$, $d_{AC}$..., $d_{BC}$.... The problem is to find a closed tour which visits each city once and has a minimum or short total path length. A tour defines a sequence 1, 2, 3, . . . m in which the cities are visited. For example, for five cities A, B, C, D, E, a typical tour might be to first visit B, then D, then A, then E, then C, then return to B. The total path length d of this tour would be $$d = d_{BD} + d_{DA} + d_{AE} + d_{EC} + d_{CB}$$

Like the problem of placing integrated chips on a board so as to minimize total interconnected path lengths, the selection of some particular short path segments precludes using some other short segments in making a closed tour.

The actual best TSP solution is computationally very hard to achieve because the problem is np (non-polynomial) complete. Usually the practical problem does not require an exact solution; a good solution is acceptable. The practical problems of perception (or circuit wiring) are not concerned with exact solutions either, but rather in finding very good solutions. Most of the very good solutions have much in common, so a collective neural network constructed in accordance with the invention can be used to find a good solution. In easy perception problems, i.e., when identification of objects perceived is easy to make, the good solution found may be best. Similarly, in the TSP solution there may be arrangements of cities in which best is so unambiguous that the good solution found will in fact be best. The present invention is able to compute such a problem.

Collective neuronal circuits of the kind to be described can also perform the calculation required for a content addressable memory of the type that, given enough 'clues' as input signals, will produce a very good response in the form of information that best matches the clues. As in other useful computations, the network of interconnected neurons involve the change of state of the network with time. The location of a particular stable point in state space is the information of the particular memory. The information in memory is reached not by knowing an address, but rather by supplying in the initial state any subpart of the memory of adequate size, i.e., enough 'clues'.

SUMMARY OF THE INVENTION

An N×N matrix of input and output conductors are provided with N amplifiers of high gain, each having at least a positive output, and, for some kinds of computational problems, a complementary negative output as well. Each amplifier has a sigmoid input-output relation, with a minimum and a maximum possible output which can be thought of as a "0" and a "1." Each input conductor of the matrix is connected to the input of a separate one of the amplifiers, and each amplifier has each of its output terminals (positive and negative) connected to a separate one of the output conductors. Where there are both positive and negative outputs, the N output terminals are to be understood to be N pairs, with each pair producing complementary output signals. Thus, each amplifier i has its input terminal connected to a separate one of the N input conductors and its input conductor connected to separate ones of the N output conductors connected to amplifiers j, where each such i, j connection is implemented with a resistor $R_{ij}$. Each amplifier has in addition an input capacitance $C_i$ and an input resistance $R_i$. The value of each resistor $R_{ij}$ is selected for the nature of the decisional operation desired. The circuit is intended to satisfy the following circuit equation of motion:

$$C_i(du_i/dt) = -u_i/p_i + \sum_j T_{ij}V_j + I_i,$$

where $$\frac{1}{R_i} = \frac{1}{p_i} + \sum_j \frac{1}{R_{ij}},$$

$u_i$ is the input voltage to amplifier i, and $V_j$ is the output from another amplifier. Each amplifier also receives an input current signal $I_i$ from a high impedance source. That equation of motion will cause the network to drive to one of a set of predetermined stable states which presents an output pattern of binary 1's and 0's.

The conductances $T_{ij}$ may take any value, including positive, negative, and zero and usually $R_{ij} = R_{ji}$. The magnitude of $T_{ij}$ is $|T_{ij}| = 1/R_{ij}$. A negative conductance implies that the resistor $R_{ij}$ is connected from the negative output terminal of amplifier i to the positive input terminal of amplifier j.

When used for accessing information in an associative memory, the input voltages of amplifiers i are set in correspondence with the individual bits of the input word for each clue (descriptor) known for the information desired. Alternatively, a constant current input $I_i$ can be applied to each input in proportion to the confidence that the "neuron" i should be "1" in the final answer and the values $u_i$ all started at the same value, typically zero. Once started, the inputs may be removed, and the matrix of interconnected amplifiers will drive to a stable state, producing at the output a unique word that represents the information itself which could include the address of a location in another memory which may then yield a block of words that comprise the information defined by the descriptors used to store and retrieve the unique word from the associative memory. As few as five or six out of twenty descriptors in the input word will normally provide the correct output word from among twenty descriptors used in storing that output word.

When used for an associative memory, all resistors can be chosen to have a value for a conductance of either some constant value or zero, depending on the information stored in binary form, and at least some of the input conductors are set to a predetermined binary one level at each bit position that is known to correspond to a bit 1 stored in memory by the $R_{ij}$ and $R_{ji}$ connecting resistors for the information stored.

When used for problem solutions, all inputs may be set approximately equal, such as to zero, or held in a pattern representing input information and the output pattern of bit's 1 and 0 define the solution. In either application, problem solving or information retrieval, the output in binary form is the best solution to the given problem.

BRIEF DESCRIPTION OF THE DRAWINGS

FIG. 4b illustrates a network of neurons, each neuron having a characteristic like that of FIG. 1 with both a positive and a complementary negative output available. Typically one but not both output terminals will be connected to output conductors.

DESCRIPTION OF PREFERRED EMBODIMENTS

Figure 1:
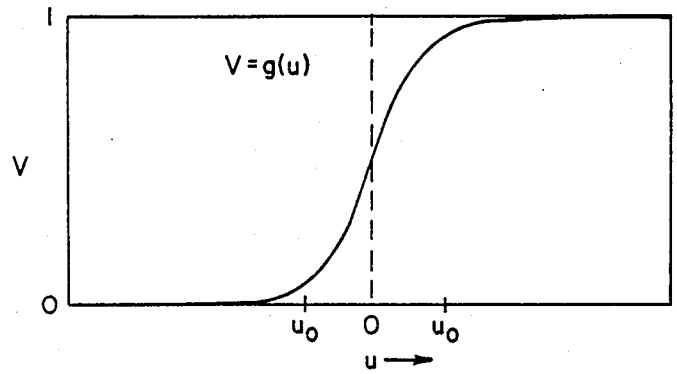
FIG. 1 illustrates the sigmoid monotonic input-output characteristic for the "neurons" implemented with amplifiers for the present invention. The extreme values of output voltage indicated as 0 and 1 can have any practical value.

An example of an implementation of the present invention will now be described using a network of N nonlinear "neurons" j with their "synaptic" interconnections for an associative memory, after which the use of such a network for a problem solution will be described. For precise description, it should be understood that the "neurons" are amplifiers with sigmoid monatonic input-output relations as shown in FIG. 1. The minimum and maximum outputs are taken as 0 and 1. The function $V = g(u)$ describes the output V due to the input u.

Figure 2:
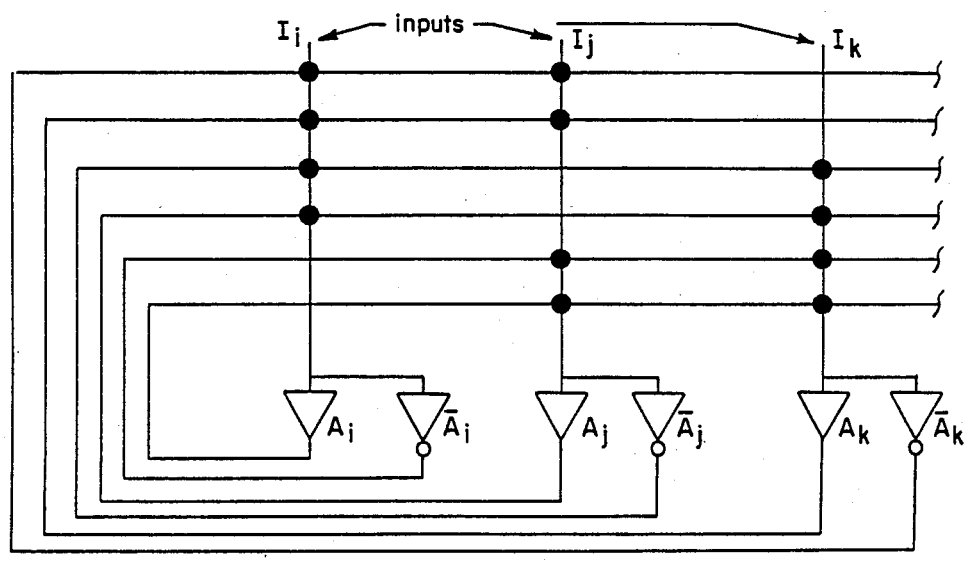
FIG. 2 illustrates schematically a network of neurons for implementation of the present invention. Solid black circles at intersections between conductors represent locations at which resistors $R_{ji}$ and $R_{ij}$ can be connected between input conductors and output conductors of neurons in the network.

FIG. 2 illustrates a simple 3×3 neuron network of noninverting and inverting amplifiers $A_1$, $A_2$, $A_3$ and $\overline{A}_1$, $\overline{A}_2$, $\overline{A}_3$. Each pair, $A_i$, $\overline{A}_i$, constitutes a neuron, and each solid black circle represents a resistor $R_{ij}$ connecting the output of an amplifier $A_j$ to the input of an amplifier $A_i$, which has either a finite value or a very large (open circuit) value. The conductance $T_{ij} = 1/R_{ij}$ may be either positive or negative, depending upon the problem. If positive, the coupling resistor from the output terminal of amplifier $A_j$ to the input terminal of amplifier $A_i$ is a finite value selected for the desired function of the network, and the coupling resistor from the output terminal of amplifier $\overline{A}_j$ to the input terminal of amplifier $A_i$ is either very large, or omitted (open circuit). For convenience, the amplifiers $A_i$ and $A_j$ will sometimes be referred to hereinafter as simply i and j. This network may, of course, be expanded to an N×N network with N of any value, such as 20, 32, or 1024. The time constants of the amplifiers are negligible.

Associative Memory

Associative memory and other useful computations in this system involve the change of state of the system with time. The motion of the state of a system of N neurons in state space describes the computation that the set of neurons is performing.

The model behaves as an associative (content addressable) memory when the state space flow generated by the algorithm is characterized by a set of assignable stable fixed points. The stable points are the memories. If the state space flow is a simple flow in which nearby points in state space tend to remain close during the flow (i.e., a nonmixing flow), then initial states which are close (in Hamming distance) to a particular stable state and far from all others will terminate in that nearby stable state.

If the location of a particular stable point in state space is thought of as the information of a particular memory of the system, states near to that particular stable point contain partial information about that memory. From an initial state of partial information about a memory, a final stable state with all the information of the memory is found. The memory is reached not by knowing an address, but rather by supplying in the initial state as 'clues' some subpart of the memory. Any subpart of adequate size will do—the memory is truly addressable by content rather than location. A given matrix may contain many memories simultaneously which are reconstructed individually from partial information in an initial state.

Convergent flow to stable states is the essential feature of this operation. There is a simple mathematical condition which guarantees that the state space flow algorithm converges on stable states. Any symmetric conductance matrix T (i.e., $T_{ij}=T_{ji}$) will produce such a flow. The proof of this property follows from the construction of an appropriate energy function which is always decreased by any state change produced by the algorithm.

A preferred model is based on continuous variables. Let the output variable $V_i$ for neuron i have the range $V_i^0 \leq V_i \leq V_i^1$, and be a continuous and monotone increasing function of the instantaneous input $u_i$ to neuron i. The typical input-output relation $V_i = g_i(u_i)$ shown in FIG. 1 is sigmoid with asymptotes $V_i^0$ and $V_i^1$. It is convenient also to define the inverse output-input relation $g_i^{-1}(V)$.

In the neuron network, $u_i$ will lag behind the instantaneous outputs $V_j$ of the other neurons because of the input capacitance $C_i$ of the amplifiers and the finite impedance between the output $V_j$ and the amplifier i. Thus, there is an RC charging equation which determines the rate of change of $u_i$.

$$C_i(du_i/dt) = \sum_j T_{ij}V_j - u_i/R_i + I_i \quad (1)$$

$$u_i = g_i^{-1}(V_i)$$

$T_{ij}V_j$ represents the electrical current input to amplifier i due to the present potential of amplifier j, and $T_{ij}$ is thus the connection efficacy. $T_{ij}$ of both signs should occur. $I_i$ is any other (fixed) input current to neuron i.

The set of equations represents the resistively connected network of electrical amplifiers shown in FIG. 2. The magnitude of $T_{ij}$ is $(1/R_{ij})$, where $R_{ij}$ is the resistor connecting the output of j to the input conductor i, while the sign of $T_{ij}$ is determined by the choice of the positive or negative output of amplifier j at the connection intersection, as noted above. $R_i$ is now $$1/R_i = 1/p_i + \sum_j 1/R_{ij} \quad (2)$$

where $p_i$ is the input resistance of amplifier i. $C_i$ is the total input capacitance of the amplifier i and its associated input lead. The output impedance of the amplifiers is assumed to be negligible. These simplifications result in Eq. (1) being appropriate for the network of FIG. 2.

Consider the quantity $$E = -\tfrac{1}{2} \sum_{i,j} T_{ij}V_iV_j + \sum_i (1/R_i) \int_o^{V_i} g_i^{-1}(V)dV \quad (3)$$

$$- \sum_i I_i V_i$$

Its time derivative for a symmetric T is $$dE/dt = -\sum_i \frac{dV_i}{dt}\left(\sum_j T_{ij}V_j - u_i/R_i + I_i\right) \quad (4)$$

The parenthesis is the right-hand side of Eq. (1), so $$dE/dt = -\sum_i C_i(dV_i/dt)(du_i/dt) \quad (5)$$

$$= -\sum_i C_i g_i^{-1'}(V_i)(dV_i/dt)^2$$

Since $g_i^{-1'}(V_i)$ is a monotone increasing function and $C_i$ is positive, each term in this sum is non-negative. Therefore $$dE/dt \leq 0, \; dE/dt = 0 \to dV_i/dt = 0 \text{ for all i.} \quad (6)$$

Together with the boundedness of E, Eq. (6) shows that the time evolution of the system is a motion in state space which seeks out minima in E and comes to a stop at such points. E is a Liapunov function for the system.

This deterministic model has a simple flow with limit points (i.e., final time-independent steady state). It can therefore be used in an associative memory or other computational tasks which can be framed as searching for minima or "best" solutions. Computational time-dependent behaviors can be produced by adding anti-symmetric contributions to $T_{ij}$.

For a given symmetric T, the stable states of the continuous system have a simple description when the gain of the "neurons" (the slope of a g(u) at midrange) is high. A slightly simplified instance of the general equations can be used to put a minimum of mathematics in the way of seeing the correspondence. The same basic idea carries over, with more arithmetic, to the general case.

Consider the case in which $V_i^0 < 0 < V_i^1$ for all i. Then the zero of voltage for each $V_i$ can be chosen such that $g_i(0) = 0$ for all i. Because the values of asymptotes are totally unimportant in all that follows, we will simplify notation by taking them as $\pm 1$ to all i. The second simplification is to treat the case in which $I_i = 0$ for all i. Finally, $T_{ii} = 0$ will be assumed for the following analysis.

This continuous system has for symmetric T the underlying energy function $$E = -\tfrac{1}{2} \sum_i \sum_{j \neq i} T_{ij}V_iV_j + 1/R_i \int_o^{V_i} g_i^{-1}(V)dV \quad (7)$$

The domain in which the final state can lie is described by an N dimensional hypercube $-1 \leq V_i \leq +1$. The maxima and minima of the first term of Eq. (7) in the domain of the hypercube $-1 \leq V_i \leq 1$ for all i lie at corners of the N-dimensional hypercube space. (Only in the pathological case that T is a positive or negative definite matrix is an extremum possible in the interior of the space. This is not the case for information storage matrices of the usual type.)

The second term in Eq. (7) alters the overall picture somewhat. To understand that alteration most easily, the gain g can be scaled, replacing $$V_i = g_i(u_i) \text{ by } V_i = g_i(\lambda u_i)$$

$$u_i = g_i^{-1}(V_i) \text{ by } u_i = 1/\lambda g_i^{-1}(V_i) \quad (8)$$

This scaling changes the steepness of the sigmoid gain curve without altering the output asymptotes. $g_i(x)$ now represents a standard form in which the scale factor $\lambda = 1$ corresponds to the gain curve itself, $\lambda \gg 1$ to a system with very high gain and a step-like gain curve, and $\lambda$ small corresponds to a low gain and flat sigmoid curve. The second term of E is now $$+1/\lambda \sum_i 1/R_i \int_0^{V_i} g_i^{-1}(V)dv \qquad (9)$$

The integral is zero for $V_i=0$ and positive otherwise, getting large as $V_i$ approaches $\pm 1$ because of the slowness with which g(V) approaches its asymptotes. However, in the high-gain limit $\lambda \to \infty$ this second term becomes negligible, and simply constrains $V_i$ to be $-1 \leq V_i \leq 1$, and the locations of the maxima and minima of the full energy expression become negligibly different from those of the first term of Eq. (7), (in the absence of inputs and zero thresholds), which have already been described. The only stable points of the very high gain continuous, deterministic system therefore correspond to the stable points in which each $V_i$ is either $+1$ or $-1$.

For large but finite $\lambda$, the second term in Eq. (7) begins to contribute. The form of $g_i(V_i)$ leads to a large positive contribution near all surfaces, edges, and corners of the hypercube while it still contributes negligibly far from the surfaces. This leads to an energy surface which still has its maxima at corners, but the minima become displaced slightly toward the interior of the space. As $\lambda$ decreases, each minimum moves further inward. As $\lambda$ is further decreased, minima disappear one at a time, when the topology of the energy surface makes a mimimum and a saddle point coalesce. Ultimately, for very small $\lambda$, the second term in Eq. (7) dominates, and the only mimimum is at $V_i = 0$. When the gain is large enough that there are many mimima, each is associated with a well-defined minimum of the infinite gain case—as the gain is increased, each minimum will move until it reaches a particular cube corner when $\lambda \to \infty$.

There are many general theorems about stability in networks of differential equations representing, for example, chemistry, circuits, and biology. The importance of this simple symmetric system is not merely its stability, but the fact that the correspondence with a discrete system lends it a special relation to elementary computational devices and concepts. The convergence of the neuronal state to its stable states is based on the existence of an energy function which directs the flow in state space.

This analysis indicates that a real circuit of operational amplifiers, capacitors, and resistors is able to operate as an associative memory, reconstructing the stable states which have been designed into T. As long as T is symmetric and the amplifiers are fast compared with the characteristic RC time of the input network, the system will converge to stable states and cannot oscillate or display chaotic behavior. While the symmetry of the network is essential to the mathematics, a pragmatic view indicates that an approximate symmetry will suffice. Equivalence of the gain curves and input capacitance of the amplifiers is not needed. For high gain systems, the stable states of the real circuit will be exactly those predicted by the T matrix alone. (The alternative case of slow amplifiers and negligible circuits RC times has similar properties.) Electromagnetic signals have finite propagation velocities. A circuit which is to operate in the mode described must have propagation delays which are considerably shorter than the limiting RC delay or amplifier time constant.

The neuron network just described with reference to FIG. 2, but with N equal to at least about 20 may be used as an associative memory where the information is stored in the form of unit values for the resistance $R_{ij}$, and the input signals are binary digits representing 'clues' as to the information sought, with a binary level of one entered for each known 'clue,' and optionally some analog value depending upon the degree of certainty of the clue. A zero is entered for each for unknown factors about the information to be retrieved.

Figure 3:
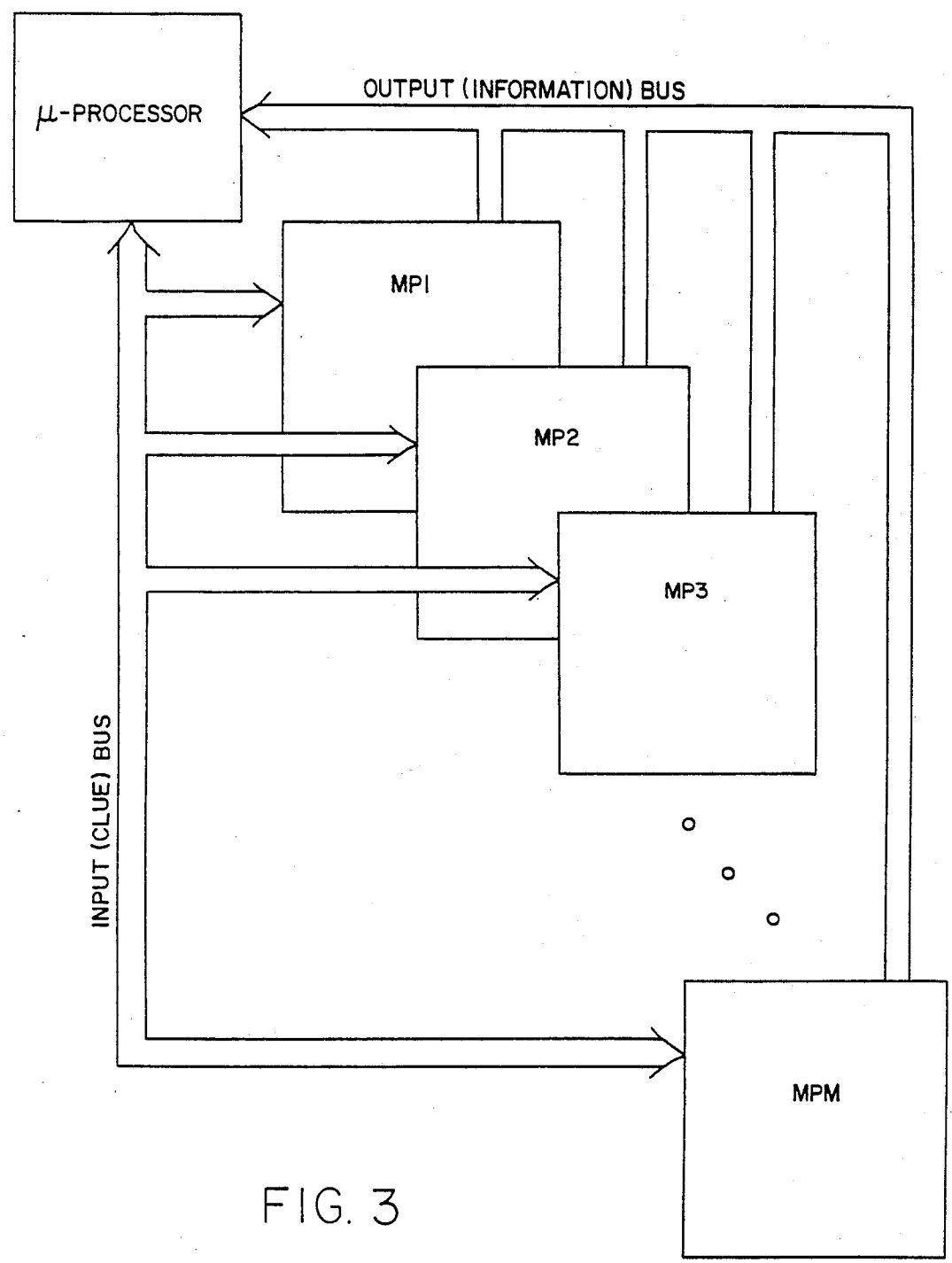
FIG. 3 illustrates an array of M networks arranged as described with reference to FIG. 2. Only positive output terminals are used for memory purposes, and each $R_{ji} = R_{ij}$ can have a standard unit value or zero (open circuit). The array of networks is connected to an input bus and an output bus for operation as an associative memory.

FIG. 3 illustrates an array of M memory planes MP1, MP2 and MP3 . . . MPM, each organized as described with reference to FIG. 2 except that each resistor $R_{ij}=-R_{ji}$ is set equal to one unit, or zero, according to the information to be stored in each plane that includes an N×N network and functions as an associative memory independent of all other planes. The additional memory planes are included to increase the total memory capacity by a factor of M. All of the memory planes are addressed in parallel with an N-bit clue word on an input bus, but only one memory plane will produce at its output terminals an N-bit binary word representing the information being retrieved from memory. All other memory planes will have a binary word consisting of all zeros at its output terminals, unless the same information is stored in a second plane, in which case both will simply output the same information (binary word) simultaneously.

An output (information) bus connects all of the planes to a microprocessor which may then display or make other use of the information. The binary word containing the clues (bit 1's) is composed at the microprocessor, either by an operator at a keyboard, an operating program stored in the microprocessor, or a combination, i.e., an operator interactive program. For example, the program could present on a display screen a menu of information categories. Upon selecting one, the computer program could then present a glossary of key words that may describe the information stored. For each key word that actually applies to the information sought, a bit 1 is entered in sequence, otherwise a bit zero is entered. The result is an N-bit binary word composed of descriptors consisting of bit 1's in specified positions. The information retrieved also consists of an N-bit binary word which is then interpreted by the microprocessor.

For example, the menu may consist of a list of fields or categories of law, such as torts. Having selected that field of law, the program then lists descriptors that may apply in sequence. For each that does apply, a bit 1 is set in the proper sequence and a bit 0 for each one that does not apply. If all the descriptors are known that were used to store the particular information sought, a binary output word would point to a case citation or citations stored in conventional memory, with maximum (100%) certainty. However, a feature of the present invention is that even with less than all the descriptors known, or with some of the descriptors in error, such as six out of twenty-five, the correct binary output word will be retrieved.

The manner of storing the information will now be described, assuming an arbitrary binary word of 25 bits having bit 1's dispersed in what would appear to be a random distribution, but would in fact have a positional relationship to descriptors. If the first and fourth bit positions have a bit 1, and the intervening positions have a bit 0, the $R_{ij}$ and $R_{ji}$ resistors for those bit positions are $R_{14}$ and $R_{41}$, which means that the output of the neuron amplifier 4 and the input of the neuron amplifier 1 are connected by a resistor of unit value, and vice versa. If the fifth bit position also has a bit 1, then amplifiers 1 and 5 are similarly interconnected with resistors $R_{15}$ and $R_{51}$ of unit value. Note that in this application of the neuronal network it is necessary to use only the positive output terminals. In addition $R_{45}$ and $R_{54}$ are included to interconnect amplifiers 4 and 5. The procedure is repeated for every pair of amplifiers i and j corresponding to the ith and jth position having a bit 1 of the 25 bit information word to be stored. All other connections in the network are left open (or connected with very large resistors of virtually infinite resistance).

More than one pattern of binary digits may be stored in a memory plane for retrieval with at least some of the bit 1's entered at the input terminals as clues common to more than one stored pattern. In determining the value of $R_{ij}$, an additional resistor is not connected between the output of amplifier i and the input of amplifier j (and vice versa to satisfy the condition $R_{ij}=R_{ji}$) if there is one already there for those situations where more than one pattern of binary digits stored share the same clue. That resistor is simply shared to store more than one pattern of binary digits. For a matrix of $1000 \times 1000$, there are 1000 neuron amplifiers, and assuming random distribution of 30 bit 1's for the information stored, there will be an average of 1000 connecting resistors for each block of information stored. Consequently, there may be about 700 words (or blocks) of information in a single plane.

When the neuron network has reached a stable state, the output signals will represent the memory which best matches the input. Since there can be $0.25N^2$ bits stored using N amplifiers, it can be appreciated that a large truly content addressable memory can be provided with a reasonable number N of neurons. The memory would, of course, be of the fixed read-only type if the $R_{ij}$ are fixed, but some flexibility in changing each network resistor $R_{ij}$ may be designed into the matrix thus allowing a capability for changing the content of the memory, just as it may be desirable to change the network for any computational function such as a TSP solution which will now be described.

Problem Solution

Figure 4A:
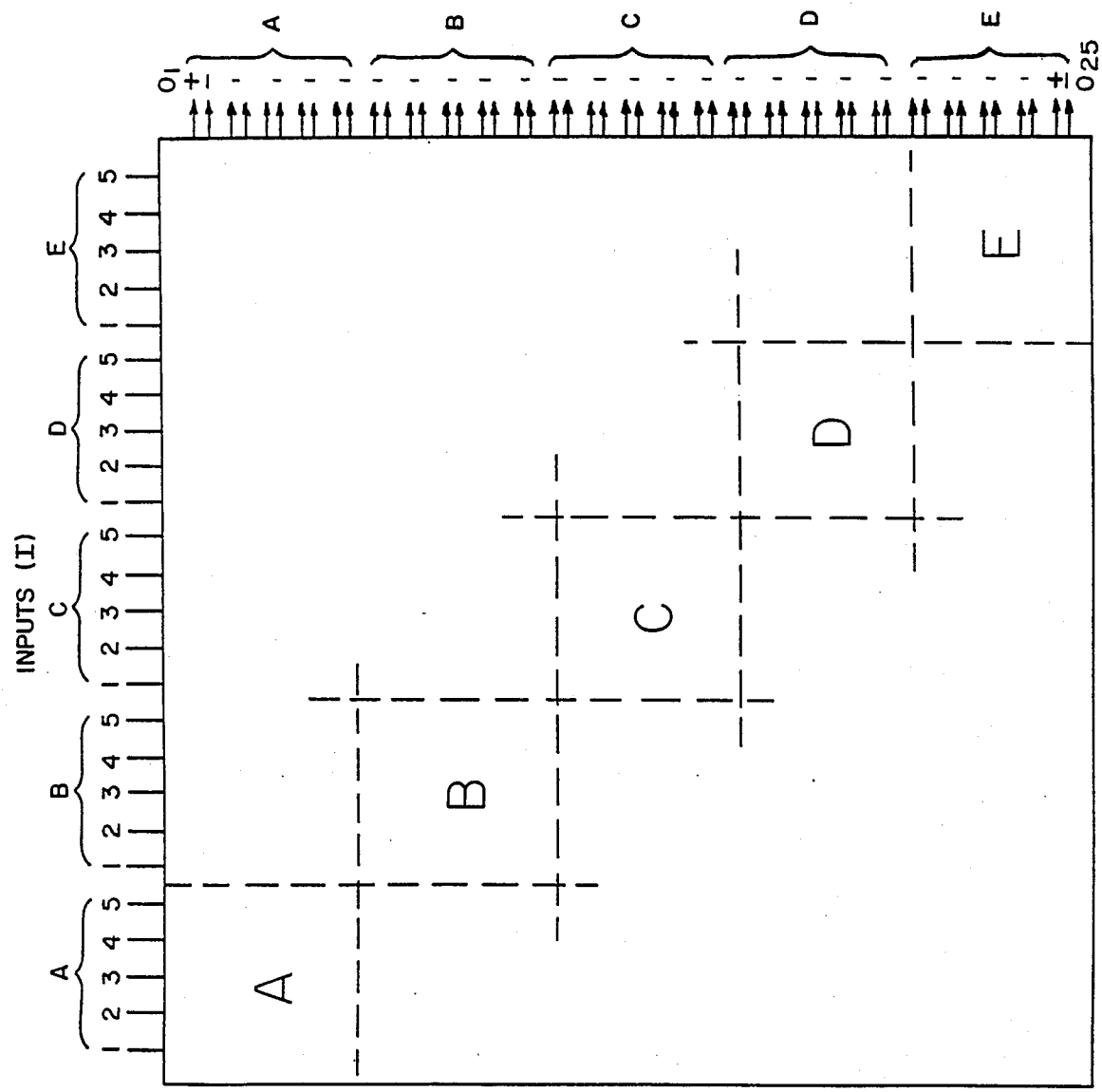
FIG. 4a illustrates schematically a network of neurons for computational use in a TSP solution for five cities.
Figure 4C:
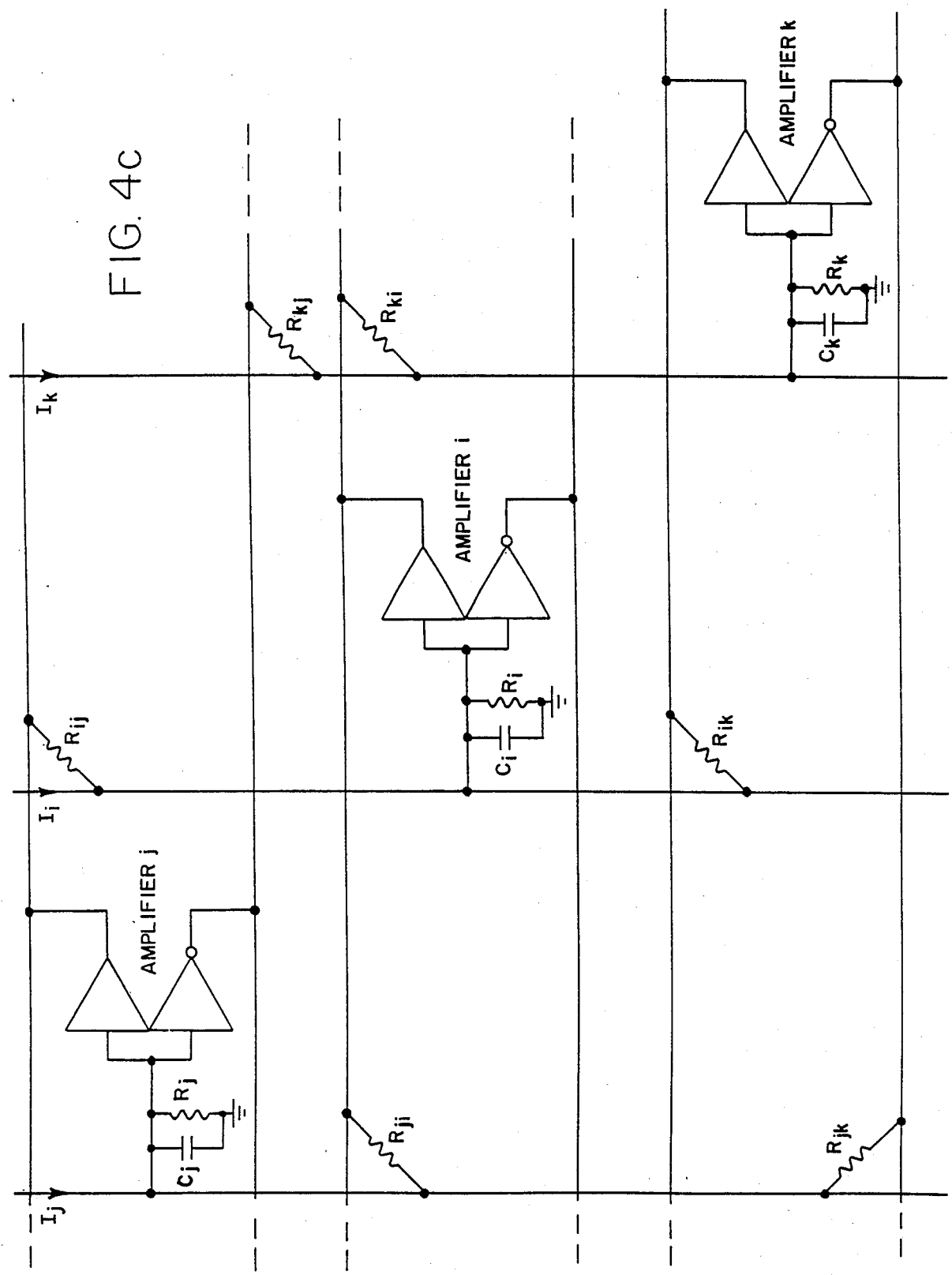
FIG. 4c illustrates in more detail the circuit implementation of each neuron in the network of FIG. 4 wherein coupling resistors $R_{ij}$ and $R_{ji}$, $R_{ki}$ and $R_{ik}$ are placed to implement positive values of $T_{ij}$, $T_{ji}$, $T_{ki}$ and $T_{ik}$ in this example, while $R_{kj}$ and $R_{jk}$ are placed to implement negative $T_{kj}$ and $T_{jk}$.

The circuit schematically illustrated in FIG. 4a, is comprised of a matrix of n groups of input conductors $I_1$ through $I_5$, paired output conductors $O^-_1$, $O^+_1$ through $O^-_{25}$, $O^+_{25}$, and neurons (amplifiers of high gain) 1 through 25 having both a positive and a complementary negative output, as shown more clearly in FIG. 4b. Each input line is connected to a single input terminal of one neuron, and to each pair of output conductors $O^-_i$, $O^+_i$ (where i is a number from 1 to $n^2$) there is a connection of an input conductor $I_j$ by an $R_{ij}$ (where j is a number from 1 to N), except for the related pair of output conductors, defined to be the pair of 5 output conductors associated with a neuron j having the same subscript j for the input conductor $I_j$ connected to the neuron j. Each connection between an input conductor and an output conductor is implemented as shown in FIG. 4c using a connecting resistor of a value that is the reciprocal of the magnitude of $T_{ij}$. The intrinsic input impedance of a neuron (amplifier) j is shown in FIG. 4c as a capacitor $C_j$ and a resistor $p_j$ to circuit ground at the input of the neuron. A conductance $T_{ij}$ connects the output of amplifier j to the input of amplifier i. This connection can be made with a resistance $R_{ij}=1/[T_{ij}]$. A negative $T_{ij}$ implies that a (positive) resistor $R_{ij}=1/[T_{ij}]$ has been connected from the input of i to the inverted output of neuron. The circuit equations of motion are as set forth in Eq. (1) above. $R_i$ is the equivalent of $p_i$ and the $R_{ij}$ according to Eq. (2) above. For simplicity, g, R, and C, are arbitrarily picked independent of i, though this is not necessary, and presumably not optimal. With obvious changes of notation in Eq. (1), the equation of motion, wich applies equally well to the associative memory, becomes $$du_i/dt = -u_i/t_o + \sum_j T_{ij} V_j + I_i \qquad (10)$$

$$T_{ij} = T_{ji}$$

$$V_j = g(u_j)$$

For a good solution, it is necessary to solve only an initial value problem, with particular $u_i$ at the starting time. The $I_i$ will be time-independent inputs, and merely have the effect of translating the gain curve along the u-axis. This network of neurons (amplifiers) has been demonstrated to be able to locate good solutions to the TSP.

It has been shown that a neuron network as shown in FIGS. 4a and b converges to a stable state. Symmetric conductances ($T_{ij}=T_{ji}$) are used, which implies that $R_{ij}=R_{ji}$. Implementing a problem in general, such as the TSP problem, consists of constructing a network of chosen $T_{ij}$, choosing an initial set of $u_i$, allowing the neuron network to converge to a stable state, and interpreting the answer from the final stable state. In order that the final output be unambiguous, the gain is chosen high enough that in the final stable state each neuron will have an output V very near 0 or 1. The output signals will then be called '0' or '1', yielding a discrete word of binary digit output signals at the set of positive output terminals (or the one's complement at the negative output terminals) for the desired answer.

Implementing the TSP Problem

The number of neurons N required to solve the "traveling salesman" problem (TSP) is $N=n^2$, where n is the number of cities A, B, C . . . to be included in the tour, and also the number of pairs of output conductors in an $N \times N$ array of vertical single input conductors and horizontal paired output conductors. The network of neurons to calculate good solutions to the TSP problem is set up in such a way that its final states always have the general structure illustrated below, with one bit 1 in each row, and each column of the array, and all other bits zero for each binary output of a set of n output terminals representing a different city. This allows the following interpretation of the final state. Each group of n neurons represents a particular city, and each bit 1 position in a group represents a location in the tour. Thus the final state

|  |  | TOUR LOCATION | | | | | |
| --- | --- | --- | --- | --- | --- | --- | --- |
|  |  | 1 | 2 | 3 | 4 | 5 | |
| CITY | A | 0 | 1 | 0 | 0 | 0 | (4) |
|  | B | 0 | 0 | 0 | 1 | 0 | |
|  | C | 1 | 0 | 0 | 0 | 0 | |
|  | D | 0 | 0 | 0 | 0 | 1 | |
|  | E | 0 | 0 | 1 | 0 | 0 | | shown above as a solution to the TSP problem represents a tour in which city C is the first city to be visited, A the second, E the third, etc. [The length of the path is $d_{CA}+d_{AE}\ldots d_{BC}$.] Each such $n \times n$ final state array of binary digits describes a particular tour of the n cities.

A tour describes an order in which cities are visited. There are 2n tours of each path-length, for each path has an n-fold degeneracy of initial city on a tour and a 2-fold degeneracy of the tour sequence order. There are n! states of the general form above representing n! possible tours. There are thus n!/2n distinct paths for closed TSP routes, and by its time evolution the network will choose one as the best solution in its final state.

In designing a computational circuit for this problem, two features of the connection matrix $T_{ij}$ are essential in this representation. First, it must be of such a nature as to favor strongly stable states of the form of those shown in the tour location table above. Second, of the n! such solutions, it must favor those representing short paths. An appropriate form for this matrix can be found by considering the very high gain limit, in which all final outputs will be 0 or 1. In this situation, the gain disappears from stability considerations, and the equations of motion lead to stable states which are local minima of the quantity $$E = -\tfrac{1}{2} \sum_{i,j}^{N} T_{ij} V_i V_j \tag{11}$$

The space over which this is minimized in the high gain limit is the $2^N$ corners of the N-dimensional hypercube defined by $V_i=0$ or 1. Because of the interpretation of stable points, the N symbols $V_i$ will be described by double indicies $V_{A,j}$. The row subscript have the interpretation of a city name, and the column subscript the position of that city in a tour.

Consider an energy function $$E = A/2 \sum_{\alpha}^{n} \sum_{i}^{n} \sum_{j \neq i}^{n} V_{\alpha i} V_{\alpha j} + B/2 \sum_{i}^{n} \sum_{\alpha}^{n} \sum_{\beta \neq \alpha}^{n} V_{\alpha i} V_{\beta i} + C/2 \left( \sum_{\alpha}^{n} \sum_{i}^{n} V_{\alpha i} - n \right)^2 \tag{12}$$

where A, B, and C are positive. The first triple sum is zero if and only if each city row $\alpha$ contains no more than one '1', (the rests of the entries being zero). The second triple sum is zero if and only if each 'position in tour' column contains no more than one '1' (the rest of the entries being zero). The third term is zero if and only if there are n entries of '1' in the entire matrix. Thus this energy function evaluated on the domain of the corners of the hypercube has minima of zero for all state matrices with only one '2' in each row, and in each column. All other states have higher energy. One additional term is necessary in the energy function to contain the information about the length of path corresponding to a given tour. Its form can be chosen as $$\tfrac{1}{2} \sum_{\alpha} \sum_{\beta \neq \alpha} \sum_{i} d_{\alpha\beta} V_{\alpha i}(V_{\beta,i+1} + V_{\beta,i-1}) \tag{13}$$

Subscripts are defined modulo n: i.e., $V_{\beta,n+j}=V_{\beta,j}$. Within the domain of states which characterize a tour, this term is numerically equal to the length of the path for that tour.

The total energy for the model consists of the sum of Equations (15) and (16). If A, B and C are appropriately large, all the really low energy states will have the form of a tour. The total energy of that state will be the length of the tour, and that state with the shortest path will be the lowest energy state.

Such a quadratic energy function defines a connection matrix $T_{ij}$. In this representation of the TSP, using four terms:

$$T_{\alpha i, \beta j} = -A \delta_{\alpha\beta}(1-\delta_{ij}) \quad \text{"inhibitory connections within each row,"} \tag{14}$$

$$-B \delta_{ij}(1-\delta_{\alpha\beta}) \quad \text{"inhibitory connections within each column,"}$$

$$-C \quad \text{"global inhibitions,"}$$

$$-d_{\alpha\beta}(\delta_{j,i+1} + \delta_{j,i-1})$$

$$[\delta_{ij} = 1 \text{ if } i = j \text{ and is 0 otherwise}]$$

In addition, the energy functions represents a bias or input term $$I_{\alpha i} = +Cn \text{ "excitation"} \tag{15}$$

Within the domain $V_{\alpha i}=0$ or 1, this connection matrix and bias are an appropriate energy function on which to search for low pathlength solutions to the TSP.

In the usual TSP problem, distance is reciprocal, i.e., the distance is independent of direction so $d_{\alpha\beta}=d_{\beta\alpha}$. In a more general problem, this need not be true. $d_{\alpha\beta} \neq d_{\beta\alpha}$ still allows T to be symmetric. When 'distances' depend on direction, the last term in Equation (17) should be written:

$$-(d_{\alpha\beta,i+1}+d_{\beta\alpha,i-1}) \tag{16}$$

This will still make $T_{\alpha i,\beta j}=T_{\beta j,\alpha i}$ but allows 'best' to depend on the direction in which a link is used.

Simulating the Neuron Network on a TSP with 10 Cities

The energy function and connection matrix just constructed was made by considering $V_i=0$ or 1, for the conventional TSP. We will use this same connection matrix with a set of continuous neurons. The domain of actual function of the network is the interior of an N-dimensional hypercube, although the line of argument which constructed the network is unable to give "tour" meaning to general point in the interior.

A set of cities is chosen at random (with uniform probability density) on the interior of a two dimensional square of edge 1, defining a particular set of $d_{AB}$. The neuron network for this problem generates the equations of motion $$(du_{\alpha i}/dt) = -(u_{\alpha i}/\tau) - A \sum_{i \neq j} V_{\alpha j} - B \sum_{\beta \neq \alpha} V_{\beta i} - C \left( \sum_{\alpha} \sum_{j} V_{\beta,j-n} \right) - D \sum_{\beta} d_{\alpha\beta}(V_{\beta,i+1} + V_{\beta,i-1}) \tag{17}$$

$$V = g(u) = \tfrac{1}{2}(1 - \tanh(u/u_o)) \text{ (all } \alpha,i)$$

The form is that described in the previous section within a scale factor. The parameter "n" has not been fixed as 10, but is used as a variable to adjust the neutral position of the amplifier. The form of the gain curve was chosen to resemble a simple transistor circuit. The set of parameters is overcomplete, for the time it takes to converge is in arbitrary units. Without loss of generality, can be set to 1.

An appropriate general size of the parameters is easily found, and an exploration of parameter values was used to find a good (but not optimized) operating point. Results refer to parameter sets for Equation 20 at or near $$A = B = 500 \quad C = 200$$
$$D = 500 \quad u_0 = .03 \quad n = 15$$

With A, B, and D equal to 500, and the greatest possible distance separation in x or y coordinates of any two cities taken as a unit distance d, the resistors $R_{ij} = R_{ji}$ for all connections referring to A, B, and D might all be chosen initially to be 10,000 ohms. Then if a city C and City E, for example, are separated by a distance of 0.37d, the resistors representing this fact are chosen to have the value (10,000 0.37) = 27,027 ohms and are added in positions $R_{C1,E2}$, $R_{C2,E3}$, $R_{C3,E4}$, ... $R_{E1,C1}$, $R_{E1,C2}$, $R_{E1,C3}$ such that the input of the first amplifier of the C group is connected to the output of each amplifier in the E group and vice versa, in accordance with Equation 20.

There are many choices of starting states (values of $u_{ai}$) which might be used. The answer being sought is a "broken symmetry" answer, since there are 2n different (degenerate) tours which describe the same path. For the system to converge to an answer, the symmetry must be broken by a small amount of random noise. Real circuits will always spontaneously do so, but in simulations this noise must be added. For example, the initial $u_{Ai}$ can be chosen as $$u_{Ai} = u_{oo} + \delta u_{Ai} \quad (18)$$

$u_{oo}$ is picked so that at $t = 0$ $$\sum_\sigma \sum_i V_{ai} \approx 10, \quad (19)$$

which is also approximately the value the system will have at $t = \infty$ ($u_{oo}$ is not a critical parameter—choosing it zero instead of as above makes no qualitative difference). The symmetry-breaking $u_{Ai}$ are each randomly chosen uniformly in the interval such as $$-\tfrac{1}{2}u_o \leq \delta u_{Ai} \leq \tfrac{1}{2}u_o \quad (20)$$

Figure 5:
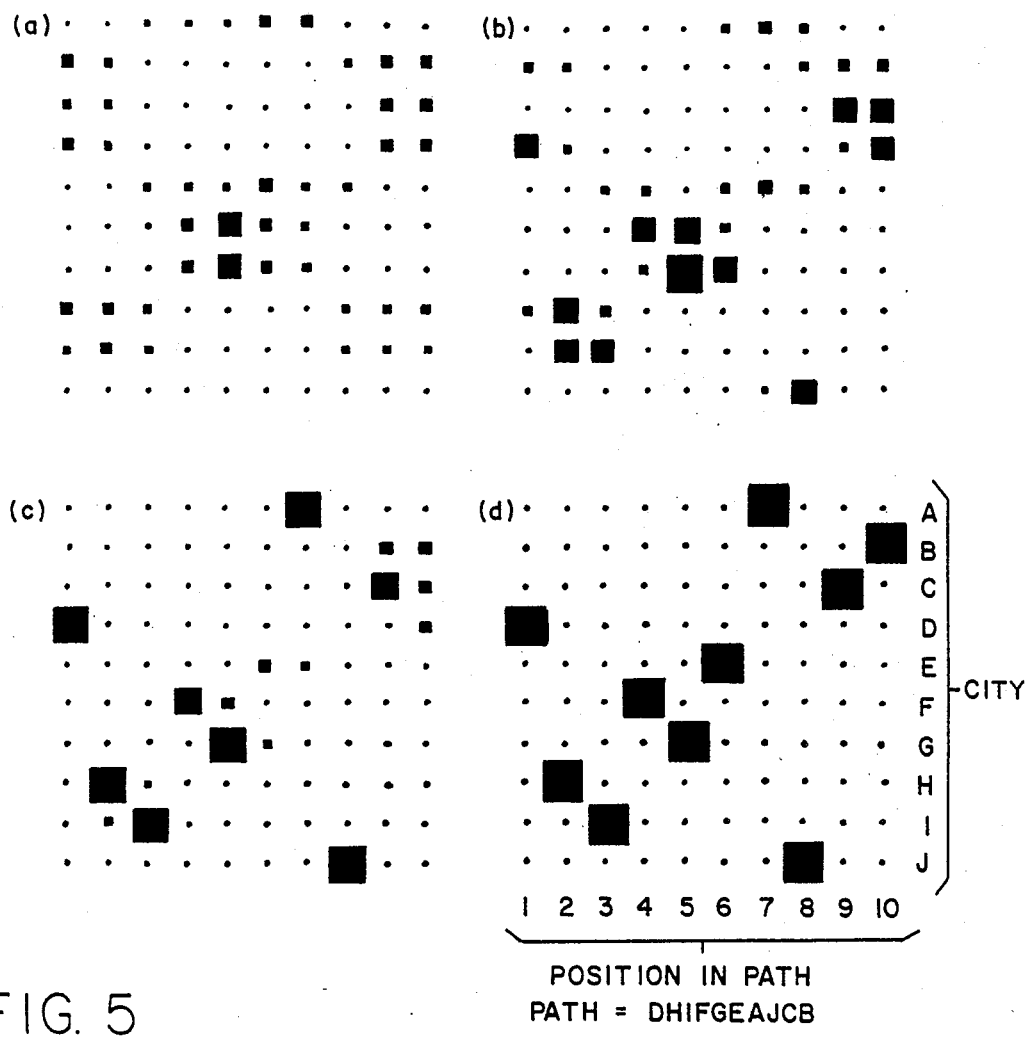
FIGS. 5a, b, c and d illustrate the convergence of the neuron network of FIG. 4a to a good TSP solution, wherein the linear dimension of the square in FIG. 4a shows the value of $V_{Ai}$ for a time near the starting time, FIGS. 4b and c for successive times, and FIG. 4d for the final state (solution).

FIGS. 5a, b, c and d show the convergence of a typical such starting state to a final state. The linear dimensions of the square are proportional to the outputs of the "neurons" in the array. In the initial state (not shown) they are very nearly uniform, and as time passes (FIGS. 5a, 5b, 5c), the outputs converge to a final time independent states (FIG. 5d). Notice that the final outputs produce a permutation array with one neuron "on" and the rest "off" in each row and column, and that this final state thus represents a legitimate tour. The choosing of the parameters is a compromise between always obtaining legitimate tours (D small) and weighting the distances heavily (D large). Too large $u_o$ results in final states which are not tours and in which values of $V_{ai}$ in the final state are not near 1 or 0. Too small $u_o$ yields a poorer selection of good paths.

Figure 6:
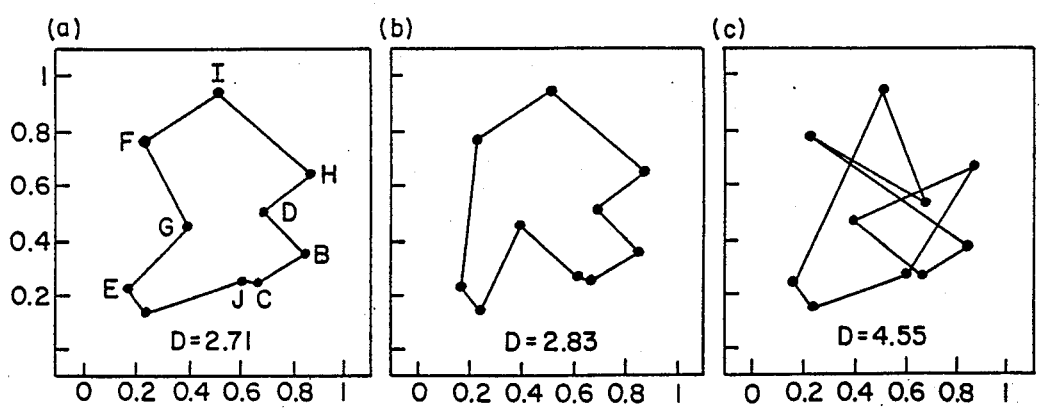
FIGS. 6a, b, and c show that the paths found by the system of FIGS. 4a, b and c on 10 random cities, as illustrated in FIGS. 5a, b, c and d, are very short
FIG. 6b is the shortest path. A random path is shown for reference in FIG. 6c.

A convergence from a given starting state is deterministic, but different starting states may lead to different final states. FIGS. 6a and 6b show typical paths obtained in this fashion. FIG. 6c shows for comparison a path that is clearly not the 'best,' or even a very good one, and so would not be selected by the system. FIG. 6a is also the best (shortest) path, found by exhaustive search of all paths by this network simulation.

Figure 7:
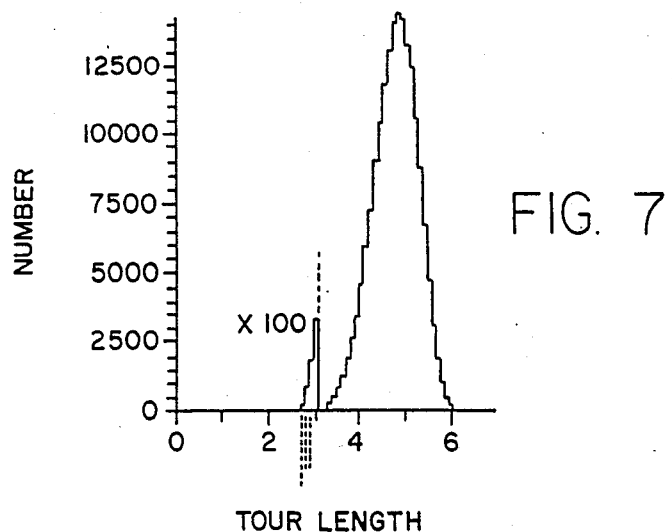
FIG. 7 is a histogram of the number of different paths between length L and L+0.1 for L=3.5, 3.6, 3.7 ... on the TSP for 10 cities. The x's give the histogram for the number of times a path between L and L+0.1 was found by a random analog algorithm in 20 tries. The region for L<3.5 has been magnified by a factor of 100 for clarity.

To see how well a selection is being made of good paths, we compare with the lengths of all possible paths. There are n!/2n = 181440 total distinct paths from n = 10, and a histogram of their length distribution is shown in FIG. 7. The paths found by the simulated N×N matrix, for n = 10 cities and N neurons = $n^2$) in 20 convergences from random states is also shown as the histogram (dot symbols) below the axis. (Of these starting states, 16 converged to legitimate tours.) About 50% of the trials produce one of the 2 shortest paths, the network does an excellent job of selecting a good path, preferring paths in the best $10^{-5}$ of all paths compared to random paths.

A person looking at this simple problem also immediately draws a very good path. Our ability to do so is based on the fact that all the relevant relationships can be drawn in two dimensions, and we can visualize the situation. No such capacity is available to the neural network. The problem the network solves has no necessity of being "flat," i.e., two dimensional. The same numerical set of 45 $d_{AB}$ can be randomly assigned to letter pairs $\alpha$, $\beta$. If this is done, no flat representation of the TSP is possible, and the ability to visually solve the problem disappears. It has been found by simulation that the network can still solve this problem. It finds this a somewhat more difficult problem, typically converging to solutions among the best 60 paths.

There is an unnecessary redundancy of search in the above. Since each path is invariant under cyclic permutation, we can eliminate the 20-fold degeneracy choice between 10± tours. A particular city j can arbitrarily be located at position 10 in a tour, reducing the degeneracy from 20 to 2, and additional noise terms can be added to break the remaining degeneracy. The performance of the network was slightly improved in this minor variant.

The collective computations using nonlinear analog circuits have aspects from both conventional digital and analog computers. In conventional analog computation, the differential equation which is solved by the electrical circuit is generally the same equation that the programmer wishes to solve in the real world. The variables in the analog computer are closely related to the real-world variables whose behavior is sought. In the present case, however, the circuit differential equation to be solved is of no intrinsic interest. This differential equation is essentially a program by which an answer to a question can be found. Digital computation conventionally involves finding such a new data representation and algorithm for the problem, by which the fixed hardware will eventually construct the desired answer. The collective mode combines the programming and data representation aspects customary to digital computation, but replaces the usual stereotyped logical behavior of a digital system by a stereotyped form of analog computation.

Why does this system work. The TSP problem describes paths which in the formulation of the energy of Equation (15) and Equation (16) involved the $V_{aj}$ having values 0 or 1. The actual analog computation involves the continuous domain, $0 \leq V_{aj} \leq 1$. The decision-making process or computation consists of the smooth motion from an initial state on the interior of the space (where the notion of a 'tour' is not even defined) to an ultimate stable point near enough a corner of the continuous domain to be able to identify with that corner. It is as though the logical operations of a calculation could be given continuous values between 'True' and 'False,' and evolve toward certainty only near the end of the calculation.

Although there may be no well-defined meaning as a 'tour' to a state vector other than one of the form shown in FIG. 5d, a qualitative generalization can be made. Suppose row C has an appreciable value in columns 5 and 6 and nowhere else, and no other row has much greater value in these same columns. Then it might be said that city C was being considered (simultaneously) for both position 5 and position 6, that other possibilities were not as likely, and that later in time this positional ambiguity should be resolved. FIG. 5a is an illustration of an intermediate time state in a TSP calculation on 10 cities using random noise initial conditions. At this state of the calculation, it appears that city A wants to be in position 6 or 7 in the tour. Cities B, C, and D want to be in positions 9, 10 or 1, but it is not at all clear which will be in which position. Similarly, position 5 is going to be captured by either city F or G, but again the order is not clear. A decision is already apparent as to roughly where on the tour various cities will be, and this is of itself adequate information to convey to the other cities and positions a restriction on the possibilities which these others should be considering. These rough assignments are plausible, as can be seen from looking at the 10 city map in FIG. 6a. The convergence works because the intermediate states so interpreted are reasonable. Though not precisely defined in terms of tours, they represent the simultaneous consideration of many similar tours. The convergences interpreted in this way moves from very roughly defined tours to higher refinement until a single tour is left. This procedure will work well in problems for which a good solution has many almost as good that are similar to it.

Without changing the basic organization, heuristics can be added to the network in a simple way by changing the matrix, changing the initial state, and changing steady state inputs. For example, in the TSP problem in two spatial dimensions on random cities, inspection shows that the best pathways essentially always connect a city to one of its four nearest neighbors. A heuristic can be added by replacing the true distance between cities which are further apart than that by augmented distances. This will lessen the possibility that such a link occur in a final path, while maintaining the appropriate distance measure for good paths.

Other Applications

Figure 8:
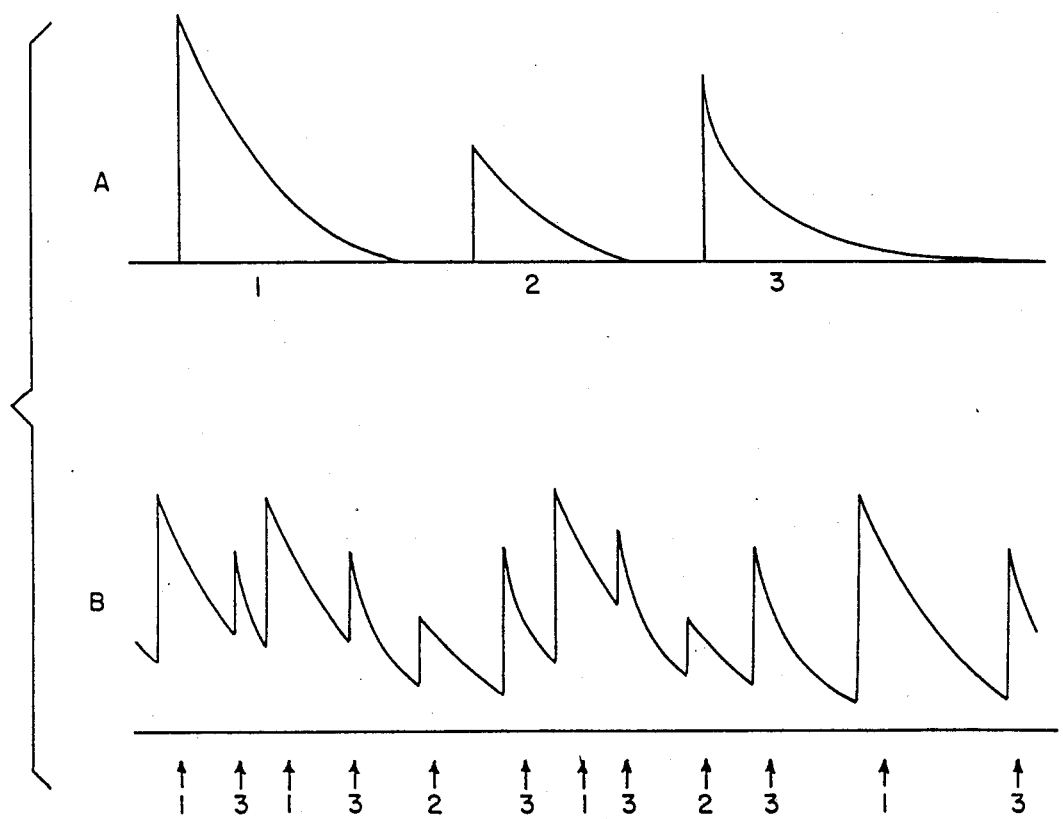
FIG. 8 illustrates in graph B a signal observed in neurobiology which require analysis in real time into types of pulses (stereotypes shown in graph A) and their time of occurrence relative to each other using the present invention in a manner analogous to a TSP best fit problem.

Still other applications of the present invention will occur to those skilled in the art, such as real time signal analysis for neurobiology. FIG. 8 illustrates in graph A typical pulses of particular shapes expected on a signal from an extracellular electrode, and in graph B a typical signal obtained in real time from a subject. An extracellular electrode picks up an electrical signal comprised of random and superimposed pulses from many neurons. Each neuron l produces pulses of a particular shape $f_l(t-t_{li})$, where $t_i$ is one of the times at which neuron l produces a pulse. The total signal S(t) seen by the electrode is to be described as $$S(t) = \sum_l \sum_{li} f_l(t - t_{li}) \quad (21)$$

The computational problem is to find the decomposition; i.e., given S(t) and the shapes $f_l(t)$, determine the discrete set of times $t_{li}$ at which each neuron l produced a pulse. The system seeks a "best fit" set of times for the different discrete shapes of pulses such that the right-hand side of the Eq. (21) is as close as possible to the observed signal S(t). The decomposition problem can be solved for a finite time interval in a single convergence of a collective network requiring only about $10^{-6}$ seconds. Thus such signal decomposition can be calculated in real time using the network herein described.

What is claimed is:

1. A network of nonlinear devices having continuous input-output relations for parallel processing of input signals, having useful collective decisional properties to which all of the input signals make a contribution to some degree in the range from 0 to 100%, comprising a matrix of N input and N output conductors, where N is a positive integer greater than 1, and each of said N output conductors may be a pair of complementary positive and negative conductors, N amplifiers of high gain, each amplifier having at least a positive output terminal and optionally a complementary negative output terminal for the case of each output conductor being comprised of a pair, each input conductor of said array being connected to the input terminal of a separate one of said amplifiers, and each amplifier having its output terminal connected to a separate one of said output conductors, each amplifier of a series . . . i, j, k . . . having its output conductor connected to the input conductor of a separate selected amplifier, where each connection is implemented with a resistor $R_{ij}$, and the value of each resistor is selected for the nature of the decisional operation intended to satisfy the following circuit equation of motion:

$$C_i(du_i/dt) = u_i/p_i + \sum_j T_{ij}V_j + I_i,$$

$$\frac{1}{p_i} = \frac{1}{R_i} + \sum_j \frac{1}{R_{ij}}$$

where the subscript letters i and j designate representative ones of said series of amplifiers, the magnitude $T_{ij}$ is a conductance equal to $1/R_{ij}$ which defines the network decisional properties, $u_i$ is the input to amplifier i at the starting time $t_o$, $I_i$ is an input signal from a high impedance current source connected to amplifier i, and $V_j$ is the output of amplifier j due to an input $u_j$ thereto, thereby presenting on said output conductors a decision expressed as binary word of N bits after said network has reached a stable state to which the conductances between amplifiers force the network.

2. An electronic network as defined in claim 1 wherein each of said N amplifiers has a single input terminal connected to a different one of said input conductors and at least a noninverting output terminal connected to a different one of said output conductors, and said conductance $T_{ij}$ may take a positive value of either zero or some finite constant set by connecting resistors $R_{ij}=R_{ji}$ for each binary one of an N-bit word stored in said N×N matrix.

3. An electronic network as defined in claim 2, wherein said input signal to each input conductor of said N×N matrix is set equal to one of two values, one of which is zero and some of which are not zero to present to the network a binary word containing at least a few binary ones in the same position as binary ones in any one of a number of N-bit words stored in said network, where the binary digits of information stored as N-bit words in determined by connecting resistors $R_{ij} \neq 0$.

4. An electronic network as defined in claim 3 wherein said input signal to each input conductor of said N×N matrix is set equal to a binary level of one plus or minus some value depending upon the degree of certainty that a binary one has been stored in the ith position by connection of resistor $R_{ij}$ and of an equal resistor $R_{ji}$, where the subscript letter i designates a representative one of said series of amplifiers . . . j, i, k, . . . not necessarily arranged in sequence.

5. An electronic network as defined in claim 1 wherein each of said N amplifiers has two complementary output terminals, one an inverting output terminal and one a noninverting output terminal, and each of said N output conductors is comprised of a pair of conductors, a different pair of said output conductors being separately connected to said two output terminals of each amplifier, one connected to the inverting output terminal and one connected to the noninverting output terminal, and the sign of $T_{ij}$ is determined by which of said pair of output conductors of amplifier j is connected to the single input conductor connected to amplifier i, where the letter i designates a representative one of said series of amplifiers . . . i, j, k, . . . .

6. An electronic network as defined in claim 5 wherein said conductance $T_{ij}$ may take any value, and $R_{ij} = R_{ji}$.

7. An electronic network as defined in claim 6 wherein said input signal to the ith amplifier of said series of amplifiers . . . i, j, k, . . . is set equal to any selected value, including zero, and $T_{ij}$ is selected to program for the solution of a predetermined problem.

8. An electronic network for collective decision based on a large number N of signals comprising an array of N amplifiers each designated by a letter from a series . . . i, j, k, . . . connected to a matrix of N input and N output conductors, each connection implemented with equal resistors $R_{ij}$ and $R_{ji}$ connecting the outputs of amplifiers j and i to the inputs of amplifiers i and j, where i and j are the ith and jth amplifiers of said series not necessarily arranged in sequence, where the value of each resistor is selected for the nature of the decisional operation intended to satisfy the following circuit equation of motion $$C_i (du_i/dt) = u_i/p_i \sum_j T_{ij} V_j + T_i$$

where $V_j = g(u_i)$ is the output of amplifier j due to an input $u_i$ and an amplifier gain g, $C_i$ is the input capacitance of amplifier i, and $R_i$ is the equivalent of $p_i$ and $R_{ij}$ according to the equation $$1/R_i = 1/p_i + \sum_j 1/R_{ij}$$

and $R_{ij} = R_{ji}$.

9. An electronic network as defined in claim 8 for the implementation of an associative memory, wherein only output terminals of one polarity are provided for connection by resistors of unit value to input terminals of amplifiers i and j for output terminals of amplifiers j and i, respectively, for the amplifier pairs i, j in each of which a binary 1 is to be stored, and with global feedback of the opposite sign, whereby the outputs of the array of amplifiers will produce a particular entire stored word chosen from the many represented in the connection matrix in response to a few bit-1 input signals $I_i$ amplifiers so connected by resistors $R_{ij}$ and $R_{ji}$.

10. An electronic network as defined in claim 9 for problem solution, wherein the resistance $R_{ij} = R_{ji}$ is selected to have a value that, with input signals at all input conductors, one or more of which may be zero, the network will drive to a stable state at the complementary output terminals which collectively provide an output code word that is a very good solution to the problem.

* * * * *